US006201837B1

(12) United States Patent
Okamoto

(10) Patent No.: US 6,201,837 B1
(45) Date of Patent: Mar. 13, 2001

(54) APPARATUS FOR RECEIVING BROADCASTING SIGNALS

(75) Inventor: Tadashi Okamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/039,993

(22) Filed: Mar. 17, 1998

(30) Foreign Application Priority Data

Mar. 27, 1997 (JP) .................................................. 9-074739

(51) Int. Cl.[7] ............................ H03K 9/00; H04L 27/22; H04B 10/00

(52) U.S. Cl. .......................... 375/316; 375/333; 359/183

(58) Field of Search .................................... 370/326, 345, 370/498; 375/316, 328, 333, 282; 455/68, 130, 334; 381/2; 359/180, 183, 181

(56) References Cited

U.S. PATENT DOCUMENTS 5,239,540 * 8/1993 Rovira et al. ........................ 370/345
5,584,051 * 12/1996 Goken .................................. 455/68
5,675,575 * 10/1997 Wall, Jr. et al. .................... 370/326

* cited by examiner

*Primary Examiner*—Stephen Chin
*Assistant Examiner*—Betsy L. Deppe
(74) *Attorney, Agent, or Firm*—Jay H. Maioli

(57) ABSTRACT

An apparatus for receiving broadcasting signals, which includes a tuner for receiving a digital audio broadcasting signal, a channel decoder for obtaining audio information data, service information data and control information based on the digital audio broadcasting signal received by the tuner, a source decoder for causing the audio information data to be subjected to a decoding processing to produce a digital audio signal, a digital audio signal transmission processor for obtaining a first digital transmission signal based on the digital audio signal, a service data producing portion for obtaining service data based on the control information and the service information data, a service data transmission processor for obtaining a second digital transmission signal based on the service data, a switch for deriving selectively the first and second digital transmission signals, and a digital output transmitter for forwarding a digital transmission output obtained based on one of the first and second digital transmission signals derived from the switch.

4 Claims, 4 Drawing Sheets

APPARATUS FOR RECEIVING BROADCASTING SIGNALS

BACKGROUND OF THE INVENTION

1. Field of the Invention

The present invention relates generally to an apparatus for receiving broadcasting signals, and more particularly, to a broadcasting signal receiving apparatus which is operative to receive a digital audio broadcasting signal and to carry out a digital transmission of a digital audio signal and service data which are obtained based on the digital audio broadcasting signal received thereby.

2. Description of the Prior Art

Although an analog audio broadcasting system which includes an amplitude-modulated (AM) audio broadcasting system in which audio information signals are transmitted in the form of an AM audio information signal and a frequency-modulated (FM) audio broadcasting system in which audio information signals are transmitted in the form of a FM audio information signal, has been put to practical use for a long time in the field of audio broadcasting, there has been recently proposed the introduction of a digital audio broadcasting system in which audio information signals are transmitted in the form of a digital audio information signal for the purpose of improving quality of audio information transmitted or received in the system. In particular, in the European Continent, the digital audio broadcasting system called "DAB" has been already put to practical use in some countries.

It is expected that the digital audio broadcasting system would have great development henceforth so as to be in the mainstream in the field of audio broadcasting, in place of the analog audio broadcasting system, some time in the not so far future. However, at present, in a region wherein the digital audio broadcasting system has been already put to practical use or has been concretely planed to be materialized, a service area in which the digital audio information signal transmitted from a broadcasting station can be properly received is restricted to be relatively small. Therefore, in the case where the digital audio broadcasting is actually carried out, the analog audio broadcasting is also carried out, in addition to the digital audio broadcasting, so that the same program is transmitted through each of the digital audio broadcasting and the analog audio broadcasting at the same time.

The digital audio broadcasting signal carries not only audio information data forming a digital audio signal but also service information data representing, for example, weather forecast, traffic information and so on, and further carries control information which are necessitated for reproducing the digital audio signal from the audio information data and the service information from the service information data on the receiving side. Such digital audio broadcasting signals are received by use of a digital audio broadcasting signal receiver.

In the digital audio broadcasting signal receiver, each of digital audio broadcasting signals transmitted respectively from a plurality of broadcasting stations is received selectively through a tuning operation by a tuner, the received digital audio broadcasting signal is subjected to a demodulation processing in a channel decoder and subjected also to a data selection processing in a program selector so as to produce the control information, service information data and audio information data, and the audio information data obtained from the program selector is subjected to a decoding in a source decoder so that the digital audio signal is reproduced. Then, digital transmissions of the digital audio signal reproduced in the source decoder, the control information obtained from the program selector and the service information data obtained from the program selector are carried out to some other device or apparatus connected to the digital audio broadcasting signal receiver.

FIG. 1 shows an example of the digital audio broadcasting signal receiver proposed previously and generally. In the digital audio broadcasting signal receiver shown in FIG. 1, a digital audio broadcasting signal transmitted from a broadcasting station and having reached a receiving antenna 11 is received through a tuning operation by a tuner 12. In the tuner 12, the received digital audio broadcasting signal is subjected to an amplifying processing and a frequency-converting processing to produce an intermediate frequency (IF) signal Sid. The IF signal Sid is supplied to an analog to digital (A/D) convertor 13. A digital IF signal Did corresponding to the IF signal Sid is obtained from the A/D convertor 13 to be supplied to a channel decoder 14.

In the channel decoder 14, the digital IF signal Did is subjected to a demodulation processing to produce control information data representing the control information, audio information data and service information data. Further, in the channel decoder 14, the audio information data and service information data are subjected respectively to time de-interleaving arrangements, and the control information data and the time de-interleaved audio information data and service information data are subjected respectively to error correction processings. Then, the control information data Dcd subjected to the error correction processing are supplied from the channel decoder 14 to a control unit 15 and a service data producing portion 16, and composite data Dmd containing the audio information data and service information data each subjected to the error correction processing is supplied from the channel decoder 14 to a program selector 17.

In the program selector 17, the audio information data and service information data are separately derived from the composite data Dmd. Then, audio information data Dad are supplied from the program selector 17 to a source decoder 18 and service information data Dsd are supplied from the program selector 17 to the service data producing portion 16.

In the source decoder 18, the audio information data Dad subjected to the error correction processing are subjected to a decoding to produce a digital audio signal Da. The digital audio signal Da thus obtained from the source decoder 18 is supplied to both a digital/analog (D/A) convertor 19 and a digital audio signal transmission processor 20.

The D/A convertor 19 is operative to cause the digital audio signal Da obtained from the source decoder 18 to be subjected to a D/A conversion to produce an analog audio signal Sa and to derive the analog audio signal Sa to an audio signal output terminal 21.

The digital audio signal transmission processor 20 is operative to produce a digital transmission signal Dat for digital transmission of the digital audio signal Da obtained from the source decoder 18. The digital transmission signal Dat produced in the digital audio signal transmission processor 20 is supplied through a driving portion 22 to a digital output transmitter 23.

The digital output transmitter 23 is operative to obtain, based on the digital transmission signal Dat from the driving portion 22, a digital transmission light output Pat for carrying out the digital transmission of the digital audio signal Da obtained from the source decoder 18 and to forward the digital transmission light output Pat to a digital transmission path 24, such as a digital optical transmission path.

In the service data producing portion 16 to which the control information data Dcd obtained from the channel decoder 14 and the service information data Dsd obtained from the program selector 17 are supplied, service data Ds are produced based on the control information data Dcd and service information data Dsd to be supplied to a service data transmission processor 25.

The service data transmission processor 25 is operative to produce a digital transmission signal Dst for digital transmission of the service data Ds obtained from the service data producing portion 16. The digital transmission signal Dst produced in the service data transmission processor 25 is supplied through a driving portion 26 to a digital output transmitter 27.

The digital output transmitter 27 is operative to obtain, based on the digital transmission signal Dst from the driving portion 26, a digital transmission light output Pst for carrying out the digital transmission of the service data Ds obtained from the service data producing portion 16 and to forward the digital transmission light output Pst to a digital transmission path 28, such as a digital optical transmission path.

The control unit 15 produces control signals Cc and Cp in response to the control information data Dcd obtained from the channel decoder 14 and supplies the channel decoder 14 with the control signal Cc for controlling thereby the operation of the channel decoder 14 and the program selector 17 with the control signal Cp for controlling thereby the operation of the program selector 17.

In general, the digital transmission light output Pat transmitted through the digital transmission path 24 in the form of, for example, the digital optical transmission path and the digital transmission light output Pst transmitted through the digital transmission path 28 in the form of, for example, the digital optical transmission path are supplied to some other device or apparatus which is connected to the digital audio broadcasting signal receiver shown in FIG. 1 and used selectively in accordance with the other device or apparatus. For example, when the other device or apparatus is an audio signal amplifier connected to the digital audio broadcasting signal receiver shown in FIG. 1, the digital transmission light output Pat transmitted through the digital transmission path 24 is amplified by the audio signal amplifier to be used for reproducing an analog audio signal, and when the other device or apparatus is a navigating apparatus for vehicles connected to the digital audio broadcasting signal receiver shown in FIG. 1, the digital transmission light output Pst transmitted through the digital transmission path 28 is received by the navigating apparatus for providing it with information for navigation.

In the digital audio broadcasting signal receiver shown in FIG. 1, a series connection of the driving portion 22 and the digital output transmitter 23 coupled to the output end of the digital audio signal transmission processor 20 are necessary for forwarding the digital transmission light output Pat to the digital transmission path 24 in response to the digital transmission signal Dat from the digital audio signal transmission processor 20, and further a series connection of the driving portion 26 and the digital output transmitter 27 coupled to the output end of the service data transmission processor 25 are also necessary for forwarding the digital transmission light output Pst to the digital transmission path 28 in response to the digital transmission signal Dst from the service data transmission processor 25.

The series connection of the driving portion 22 and the digital output transmitter 23 and the series connection of the driving portion 26 and the digital output transmitter 27 can be formed to have the same structure as each other. This means apparently that a couple of circuit portions capable of having the same structure are provided for forwarding the digital transmission light outputs Pat and Pst to the digital transmission paths 24 and 28, respectively.

Besides, the digital transmission light outputs Pat and Pst transmitted respectively through the digital transmission paths 24 and 28 are usually used selectively in accordance with an electronic apparatus connected to the digital audio broadcasting signal receiver shown in FIG. 1. That is, usually the digital transmission light outputs Pat and Pst transmitted respectively through the digital transmission paths 24 and 28 are not used at the same time but used with seperately.

Since a couple of circuit portions capable of having the same structure are provided for forwarding the digital transmission light outputs Pat and Pst to the digital transmission paths 24 and 28, respectively, as aforementioned, there is room for improvement to simplify the circuit portions so as to have an improved coefficient of utilization and to reduce the cost thereof in the digital audio broadcasting signal receiver shown in FIG. 1.

OBJECTS AND SUMMARY OF THE INVENTION

Accordingly, it is an object of the present invention to provide an apparatus for receiving broadcasting signals, by which a digital audio broadcasting signal is received and a digital audio signal and service data obtained based on the received digital audio broadcasting signal are transmitted in the manner of digital transmission, and which avoids the aforementioned disadvantages encountered with the prior art.

Another object of the present invention is to provide an apparatus for receiving broadcasting signals, by which a digital audio broadcasting signal is received and a digital audio signal and service data obtained based on the received digital audio broadcasting signal are transmitted in the manner of digital transmission, and which has a circuit portion for forwarding digital transmission outputs based on the digital audio signal and the service data, respectively, which is simplified in structure to have improved coefficient of utilization and to reduce the cost of the whole circuit construction.

A further object of the present invention is to provide an apparatus for receiving broadcasting signals, by which a digital audio broadcasting signal is received and a digital audio signal and service data obtained based on the received digital audio broadcasting signal are transmitted in the manner of digital transmission, and which has a simplified circuit portion capable of forwarding either of digital transmission outputs based on the digital audio signal and the service data, respectively, with improved coefficient of utilization.

According to the present invention, there is provided an apparatus for receiving broadcasting signals, which comprises a tuning portion for receiving selectively digital audio broadcasting signals, a first decoding portion for obtaining audio information data, service information data and control information based on the digital audio broadcasting signal received by the tuning portion, a second decoding portion for causing the audio information data to be subjected to a decoding processing to produce a digital audio signal, a digital audio signal transmission processing portion for obtaining a first digital transmission signal based on the digital audio signal, a service data producing portion for obtaining service data based on the control information and the service information data, a service data transmission processing portion for obtaining a second digital transmission signal based on the service data, a signal selecting portion for deriving selectively the first digital transmission signal obtained form the digital audio signal transmission processing portion and the second digital transmission signal obtained from the service data transmission processing portion, and a digital output transmitting portion for forwarding a digital transmission output obtained based on one of the first and second digital transmission signals derived from the signal selecting portion.

In an embodiment of the apparatus for receiving broadcasting signals according to the present invention, each of the first digital transmission signal obtained from the digital audio signal transmission processing portion and the second digital transmission signal obtained from the service data transmission processing portion is composed of a series of frame units and a frame structure of the first digital transmission signal is substantially the same as a frame structure of the second digital transmission signal.

In the apparatus for receiving broadcasting signals thus constituted in accordance with the present invention, the control information, the service information data and the audio information data are obtained based on the digital audio broadcasting signal received by the tuning portion from the first decoding portion, the digital audio signal is reproduced based on the audio information data in the second decoding portion, and the service data is produced based on the control information and the service information data in the service data producing portion. Further, the first digital transmission signal is obtained based on the reproduced digital audio signal from the digital audio signal transmission processing portion and the second digital transmission signal is obtained based on the produced service data from the service data transmission processing portion.

Each of the first and second digital transmission signals is composed of a series of frame units and has substantially the same frame structure. Then, either of the first and second digital transmission signals is derived through the signal selecting portion to be supplied to the digital output transmitting portion. As a result, the digital transmission output corresponding to one of the first and second digital transmission signals derived from the signal selecting portion is forwarded from the digital output transmitting portion. The digital transmission output thus forwarded from the digital output transmitting portion is transmitted through the digital transmission path in the form of, for example, the digital optical transmission path.

Accordingly, in the apparatus for receiving broadcasting signals according to the present invention, the digital transmission output obtained based on the first digital transmission signal which is obtained based on the digital audio signal reproduced based on the received digital audio broadcasting signal and the digital transmission output obtained based on the second digital transmission signal which is obtained based on the service data produced based on the received digital audio broadcasting signal are forwarded selectively through the digital output transmitting portion provided to be common to both the digital transmission outputs, and transmitted through the digital transmission path in the form of, for example, the digital optical transmission path.

Consequently, with the apparatus for receiving broadcasting signals according to the present invention, each of the digital transmission outputs based on the digital audio signal and the service data, respectively, can be forwarded through the circuit portion which is simplified in structure to have improved coefficient of utilization and to reduce the cost of the whole circuit construction.

The above, and other objects, features and advantages of the present invention will be become apparent from the following detailed description taken in conjunction with the accompanying drawings.

DESCRIPTION OF THE PREFERRED EMBODIMENTS

Figure 1:
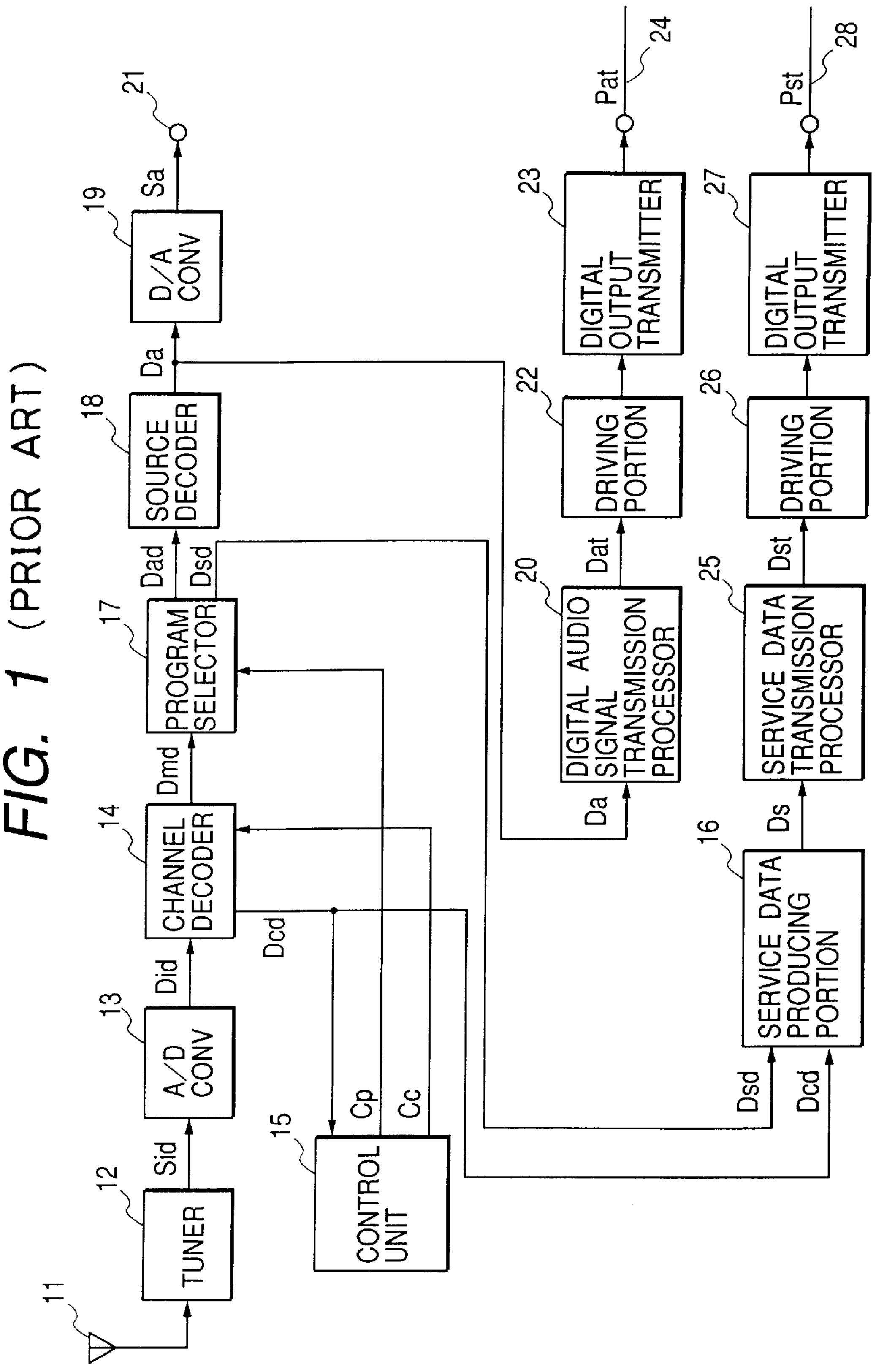
FIG. 1 (PRIOR ART)
FIG. 1 is a schematic block diagram showing an example of apparatus for receiving broadcasting signals proposed previously.
Figure 2:
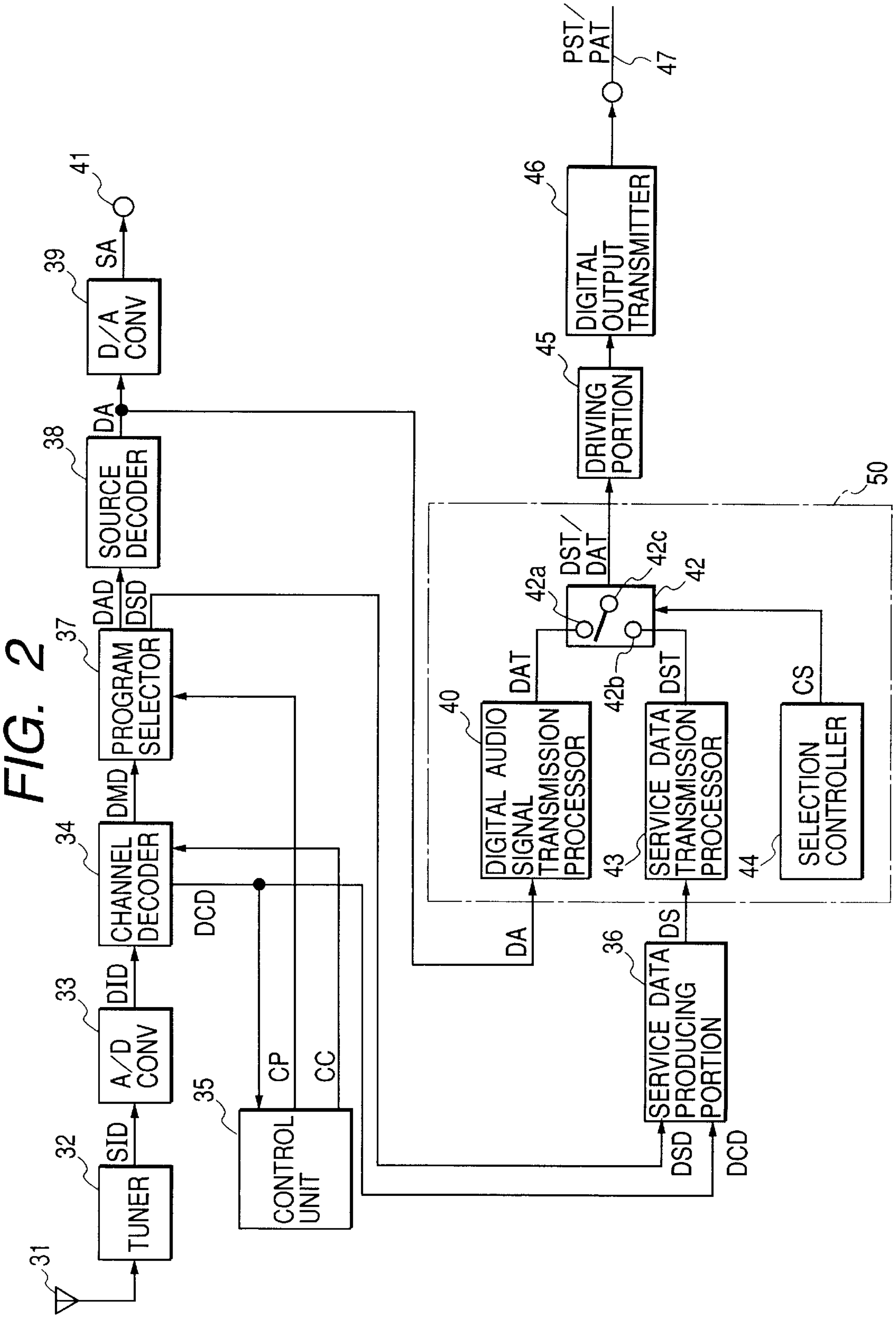
FIG. 2 is a schematic block diagram showing an embodiment of apparatus for receiving broadcasting signals according to the present invention.

FIG. 2 shows schematically an embodiment of apparatus for receiving broadcasting signals according to the present invention.

Referring to FIG. 2, in the embodiment, a digital audio broadcasting signal transmitted from a broadcasting station and having reached a receiving antenna 31 is received through a tuning operation by a tuner 32.

The digital audio broadcasting signal received by the tuner 32 is a modulated wave signal obtained by modulating a carrier wave signal with digital data in accordance with the Orthogonal Frequency Division Multiplexing (OFDM) system and the digital data is composed of a series of frame units, each of which is called a transmission frame.

Figures 3A, 3B, 3C, 3D, 3E:
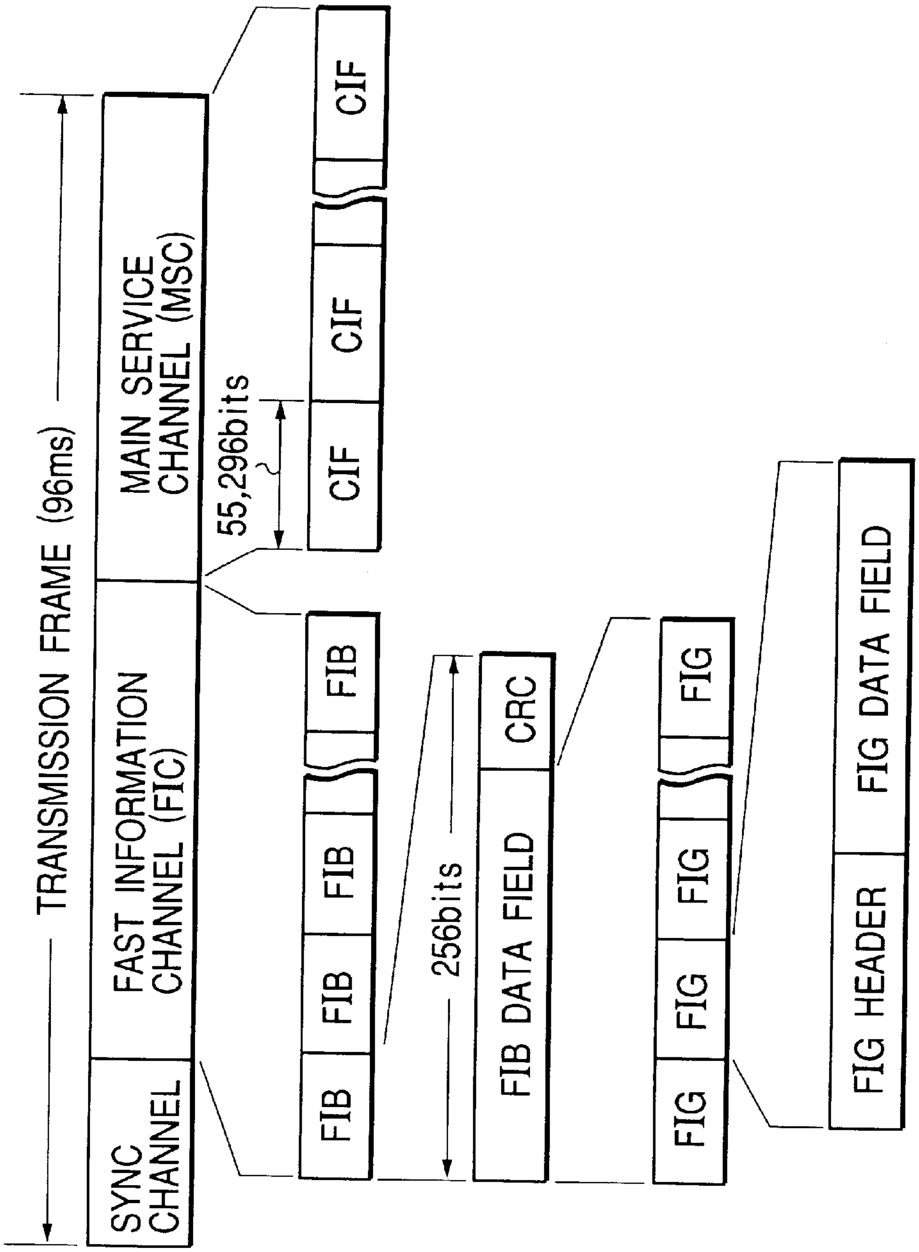
FIGS. 3A to 3E are illustrations showing data formats used for explaining a digital audio broadcasting signal received by the embodiment shown in FIG. 2.

The transmission frame has a time duration of, for example, 96 ms and contains three portions of a synchronous channel, a first information channel (FIC) and a main service channel (MSC), as shown in FIG. 3A. The MSC is composed of a series of common interleaved frames (CIFs), each of which corresponds to 55,296 bits, as shown in FIG. 3B, and transmits audio information data and service information data.

The FIC is composed of a series of first information blocks (FIBs), as shown in FIG. 3B. Each of the FIBs corresponds to 256 bits and contains a couple of portions of a FIB data field and an error checking word CRC (Cyclic Redundancy Check), as shown in FIG. 3C. The FIB data field is composed of a series of first information groups (FIGs), as shown in FIG. 3D. Each of FIGs contains a couple of portions of an FIG header and an FIG data field, as shown in FIG. 3E. The FIC thus formed transmits control information, such as multiplex configuration information (MCI) and other information.

In the tuner 32, the received digital audio broadcasting signal is subjected to an amplifying processing and a frequency-converting processing to produce an intermediate frequency (IF) signal SID. The IF signal SID is supplied to an A/D convertor 33. A digital IF signal DID corresponding to the IF signal SID is obtained from the A/D convertor 33 to be supplied to a channel decoder 34.

In the channel decoder 34, the digital IF signal DID is subjected to various signal processings including a quadrature demodulation processing, a signal conversion processing for converting a time domain signal to a frequency domain signal and so on, so as to produce control information data which represents the control information containing the MCI transmitted by the FIC, the audio information data transmitted by the MSC and the service information data transmitted by the MSC. Further, in the channel decoder 34, the audio information data and service information data are subjected respectively to time de-interleaving arrangements, and the control information data and the time de-interleaved audio information data and service information data are subjected respectively to error correction processings. Then, the control information data DCD subjected to the error correction processing are supplied from the channel decoder 34 to a control unit 35 and a service data producing portion 36, and composite data DMD containing the audio information data and service information data each subjected to the error correction processing is supplied from the channel decoder 34 to a program selector 37.

In the program selector 37, the audio information data and service information data are separately derived from the composite data DMD. Then, audio information data DAD are supplied from the program selector 37 to a source decoder 38 and service information data DSD are supplied from the program selector 37 to the service data producing portion 36.

In the source decoder 38, the audio information data DAD subjected to the error correction processing are subjected to a high efficiency decoding by which data suppressed in accordance with a high efficiency coding are expanded to produce a digital audio signal DA. The digital audio signal DA thus obtained from the source decoder 38 is supplied to both a D/A convertor 39 and a digital audio signal transmission processor 40.

The D/A convertor 39 is operative to cause the digital audio signal DA obtained from the source decoder 38 to be subjected to a D/A conversion to produce an analog audio signal SA based on the digital audio signal DA and to derive the analog audio signal SA to an audio signal output terminal 41.

The digital audio signal transmission processor 40 is operative to produce a digital transmission signal DAT for digital transmission of the digital audio signal DA obtained from the source decoder 38. The digital transmission signal DAT produced in the digital audio signal transmission processor 40 is supplied to a selective contact 42*a* of a switch 42.

In the service data producing portion 36 to which the control information data DCD obtained from the channel decoder 34 and the service information data DSD obtained from the program selector 37 are supplied, service data DS are produced based on the control information data DCD and service information data DSD to be supplied to a service data transmission processor 43.

The service data transmission processor 43 is operative to produce a digital transmission signal DST for digital transmission of the service data DS obtained from the service data producing portion 36. The digital transmission signal DST produced in the service data transmission processor 43 is supplied to a selective contact 42*b* of the switch 42.

The digital transmission signal DAT produced in the digital audio signal transmission processor 40 is formed into a biphase signal having a specific data format composed of a series of predetermined frame units. Each of the frame units constituting the digital transmission signal DAT contains seven portions of a preamble, auxiliary data, audio information data based on the digital audio signal DA, a parity flag (V), user data (U), a channel status (C) and parity bits (P), as shown in FIG. 4A.

The digital transmission signal DST produced in the service data transmission processor 43 is also formed into a biphase signal having a specific data format composed of a series of predetermined frame units. Each of the frame units constituting the digital transmission signal DST contains seven portions of a preamble, service information data based on the service data DS, frame type data (FT data), a parity flag (V), user data (U), a channel status (C) and parity bits (P), as shown in FIG. 4B.

Figure 4A:
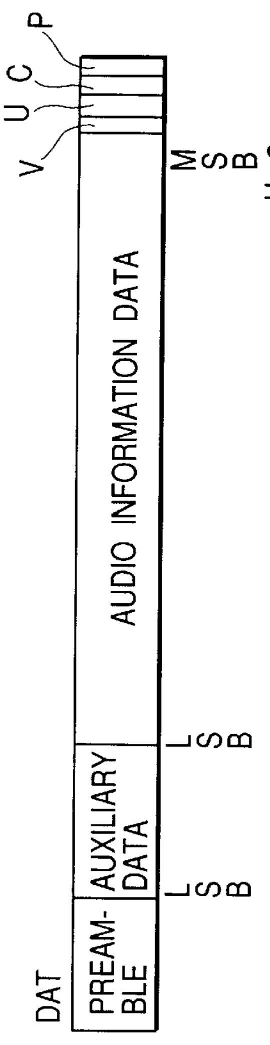
FIGS. 4A and 4B are illustrations showing data formats used for explaining digital transmission signals formed in the embodiment shown in FIG. 2.
Figure 4B:
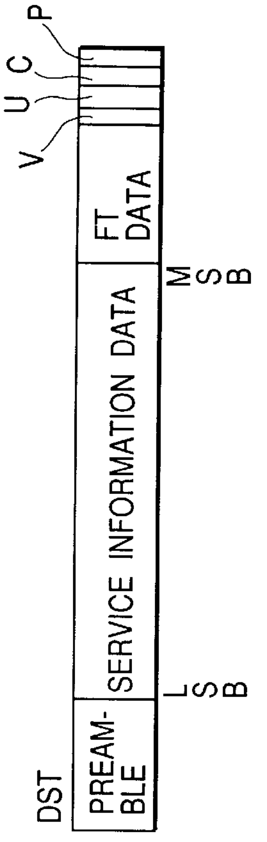

The structure of each of the frame units constituting the digital transmission signal DST shown in FIG. 4B corresponds to such a structure as obtained by replacing the portions of the auxiliary data and the audio information data contained in each of the frame units constituting the digital transmission signal DAT shown in FIG. 4A with the portions of the service information data and the FT data contained in each of the frame units constituting the digital transmission signal DST. This means that the structure of each of the frame units constituting the digital transmission signal DST shown in FIG. 4B is substantially the same as the structure of each of the frame units constituting the digital transmission signal DAT shown in FIG. 4A. Accordingly, it is clearly understood that the frame structure of the digital transmission signal DST is substantially the same as the frame structure of the digital transmission signal DAT.

A selection control signal CS from a selection controller 44 is supplied to the switch 42 having the selective contact 42*a* to which the digital transmission signal DAT is supplied and the selective contact 42*b* to which the digital transmission signal DST is supplied. In the switch 42, a movable contact 42*c* is so controlled by the selection control signal CS from the selection controller 44 as to be selectively connected with either of the selective contacts 42*a* and 42*b*. When the movable contact 42*c* is connected with the selective contact 42*a*, the digital transmission signal DAT appears through the selective contact 42*a* at the movable contact 42*c* and therefore the switch 42 is put in a condition wherein the digital transmission signal DAT from the digital audio signal transmission processor 40 is derived from the switch 42. On the other hand, when the movable contact 42*c* is connected with the selective contact 42*b*, the digital transmission signal DST appears through the selective contact 42*b* at the movable contact 42*c* and therefore the switch 42 is put in a condition wherein the digital transmission signal DST from the service data transmission processor 43 is derived from the switch 42.

The switch 42 thus controlled by the selection control signal CS from the selection controller 44 constitutes a signal selecting portion for deriving selectively the digital transmission signal DAT from the digital audio signal transmission processor 40 and the digital transmission signal DST from the service data transmission processor 43. The digital transmission signal DAT or the digital transmission signal DST derived from the switch 42 is supplied through a driving portion 45 to a digital output transmitter 46 which is provided in common to both of the digital transmission signals DAT and DST. The digital output transmitter 46 is operative selectively to obtain, based on the digital transmission signal DAT from the driving portion 45, a digital transmission light output PAT for carrying out digital optical transmission of the digital audio signal DA obtained from the source decoder 38 and to forward the digital transmission light output PAT to a digital transmission path 47, such as a digital optical transmission path, and further operative selectively to obtain, based on the digital transmission signal DST from the driving portion 45, a digital transmission light output PST for carrying out digital optical transmission of the service data DS obtained from the service data producing portion 36 and to forward the digital transmission light output PST to the digital transmission path 47.

The control unit 35 produces control signals CC and CP in response to the control information data DCD obtained from the channel decoder 34 and supplies the channel decoder 34 with the control signal CC for controlling thereby the operation of the channel decoder 34 and the program selector 37 with the control signal CP for controlling thereby the operation of the program selector 37.

As described above, the driving portion 45 and digital output transmitter 46 connected with the output terminal of the switch 42, which constitutes the signal selecting portion for deriving selectively the digital transmission signal DAT from the digital audio signal transmission processor 40 and the digital transmission signal DST from the service data transmission processor 43, are provided to be common to both of the digital transmission signals DAT and DST each having substantially the same frame structure. Consequently, the driving portion 45 and digital output transmitter 46 constitute a circuit portion which is simplified in structure to have an improved coefficient of utilization and to reduce the cost of the whole circuit construction in the embodiment shown in FIG. 2.

As a result, with the embodiment shown in FIG. 2, each of the digital transmission signal DAT based on the digital audio signal DA and the digital transmission signal DST based on the service data DS can be forwarded through the circuit portion which is simplified in structure to have improved coefficient of utilization and to reduce the cost of the whole circuit construction.

Figure 5:
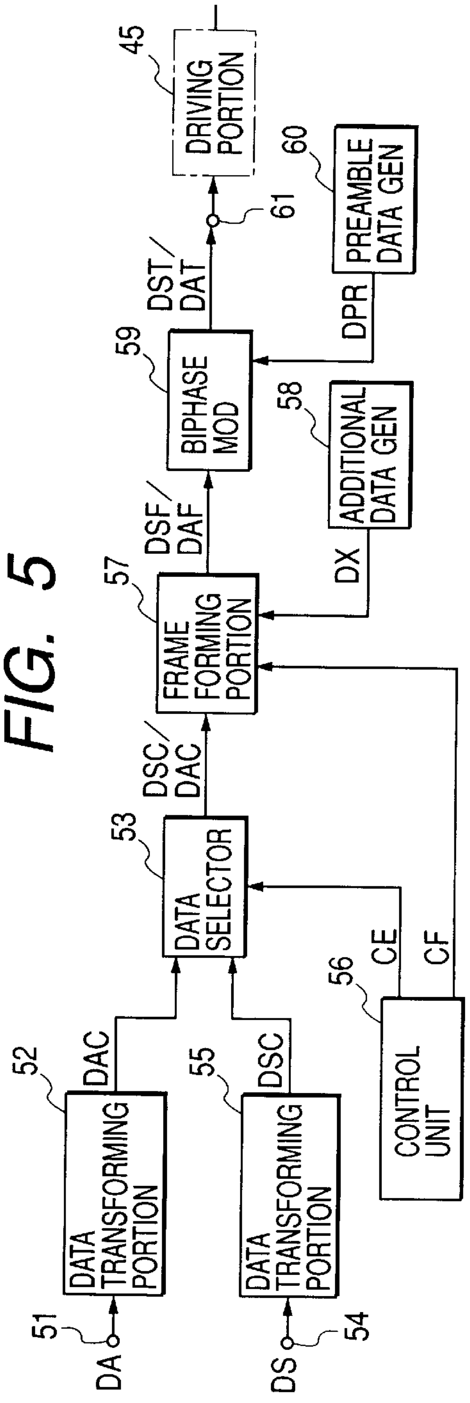
FIG. 5 is a schematic block diagram showing an example of a circuit structure which can be used for substituting for a circuit portion of the embodiment shown in FIG. 2.

FIG. 5 shows an example of a circuit structure which can be used for substituting for a circuit portion 50 of the embodiment shown in FIG. 2.

Referring to FIG. 5, the digital audio signal DA obtained from the source decoder 38 shown in FIG. 2 is supplied through a terminal 51 to a data transforming portion 52 and audio information data DAC based on the digital audio signal DA are obtained from the data transforming portion 52 to be supplied to a data selector 53. Further, the service data DS obtained from the service data producing portion 36 shown in FIG. 2 is supplied through a terminal 54 to a data transforming portion 55 and service information data DSC based on the service data DS are obtained from the data transforming portion 55 to be supplied to the data selector 53.

The data selector 53 is operative, in response to a selection control signal CE from a control unit 56, to derive selectively either of the audio information data DAC and the service information data DSC and to supply the audio information data DAC or the service information data DSC derived thereby to a frame forming portion 57. Additional data DX from an additional data generator 58 and an operation control signal CF from the control unit 56 are also supplied to the frame forming portion 57.

The frame forming portion 57 is operative to perform first and second frame forming operations selectively in response to the operation control signal CF from the control unit 56. In the first frame forming operation, such a frame unit as shown in FIG. 4A with the portion of the preamble set to be blank is repeatedly formed based on the audio information data DAC supplied from the data selector 53 and the additional data DX supplied from the additional data generator 58, and in the second frame forming operation, such a frame unit as shown in FIG. 4B with the portion of the preamble set to be blank is repeatedly formed based on the service information data DSC supplied from the data selector 53 and the additional data DX supplied from the additional data generator 58.

When the frame forming portion 57 performs the first frame forming operation, audio information frame data DAF are obtained from the frame forming portion 57 to be supplied to a biphase modulator 59, and when the frame forming portion 57 performs the second frame forming operation, service information frame data DSF are obtained from the frame forming portion 57 to be supplied to the biphase modulator 59. Preamble data DPR from a preamble data generator 60 are also supplied to the biphase modulator 59.

When the audio information frame data DAF are supplied from the frame forming portion 57 to the biphase modulator 59, in the biphase modulator 59, the preamble data DPR from the preamble data generator 60 are put into the portion of the preamble of each of the frame units constituting the audio information frame data DAF and the audio information frame data DAF to which the preamble data DPR have been added are subjected to a biphase modulation processing so as to produce the digital transmission signal DAT based on the digital audio signal DA obtained from the source decoder 38 shown in FIG. 2.

Further, when the service information frame data DSF are supplied from the frame forming portion 57 to the biphase modulator 59, in the biphase modulator 59, the preamble data DPR from the preamble data generator 60 are put into the portion of the preamble of each of the frame units constituting the service information frame data DSF and the service information frame data DSF to which the preamble data DPR have been added are subjected to the biphase modulation processing so as to produce the digital transmission signal DST based on the service data DS obtained from the service data producing portion 36 shown in FIG. 2.

Then, the digital transmission signal DAT or DST obtained from the biphase modulator 59 is supplied through a terminal 61 to the driving portion 45 shown in FIG. 2.

In the case where the circuit structure shown in FIG. 5 is applied to the embodiment shown in FIG. 2, the frame forming portion 57, additional data generator 58, biphase modulator 59 and preamble data generator 60 are provided to be common to both the digital transmission signals DAT and DST, in addition to the driving portion 45 and digital output transmitter 46. Therefore, it is expected that the circuit structure is simplified much more and the efficiency of utilization of the circuit structure is further improved.

Incidentally, the digital transmission light output PAT transmitted through the digital transmission path 47 from the embodiment shown in FIG. 2 is, for example, amplified by an audio signal amplifier connected to the digital transmission path 47 to be used for reproducing an analog audio signal, and the digital transmission light output PST transmitted through the digital transmission path 47 from the embodiment shown in FIG. 2 is, for example, received by a navigating apparatus connected to the digital transmission path 47 for providing it with information for navigation.

What is claimed is:

1. An apparatus for receiving broadcasting signals comprising:

a tuning portion for receiving a digital audio broadcasting signal;

a first decoding portion for obtaining audio information data, service information data, and control information from said digital audio broadcasting signal received by said tuning portion;

a second decoding portion for decoding said audio information data to produce a digital audio signal;

a digital audio data transforming portion for obtaining digital audio information data from said digital audio signal;

a service data producing portion for obtaining service data from said control information and said service information data;

a service data transforming portion for obtaining digital transformed service information data from said service data;

a data selecting portion for selecting one of said digital audio information data produced by said digital audio data transforming portion and said digital transformed service information data produced by said service data transforming portion;

a biphase modulator portion for performing biphase modulation processing on the one of the digital audio information data and the digital transformed service information data selected by said data selecting portion and producing a biphase modulated data signal; and a digital output transmitting portion for transmitting a digital transmission output based on said biphase modulated data signal.

2. The apparatus for receiving broadcasting signals according to claim 1, wherein said digital output transmitting portion further comprises digital optical transmission means for transforming said digital transmission output into a digital transmission light output.

3. The apparatus for receiving broadcasting signals according to claim 1, further comprising a frame forming portion for forming said digital audio information data and said digital transformed service information data from said data selecting portion into respective series of frame units, and a frame structure of said digital audio information data is substantially the same as a frame structure of said digital transformed service information data.

4. The apparatus for receiving broadcasting signals according to claim 1, further comprising digital/analog converting means for converting said digital audio signal obtained from said second decoding portion to an analog audio signal.

* * * * *